United States Patent
Mahlein et al.

(10) Patent No.: US 12,392,480 B2
(45) Date of Patent: Aug. 19, 2025

(54) ELECTRICAL APPLIANCE WITH HOUSING HAVING AN ILLUMINATED CABLE BUSHING

(71) Applicant: SEW-EURODRIVE GMBH & CO. KG, Bruchsal (DE)

(72) Inventors: Jochen Mahlein, Karlsruhe (DE); Harald Wolf, Ubstadt-Weiher (DE); Alexander Heier, Karlsdorf-Neuthard (DE); Detlev Schroeder, Lustadt (DE); Adam Miles, Greer, SC (US); Will Francis, Roanoke, IN (US)

(73) Assignee: SEW-EURODRIVE GMBH & CO. KG, Bruchsal (DE)

( * ) Notice: Subject to any disclaimer, the term of this patent is extended or adjusted under 35 U.S.C. 154(b) by 0 days.

(21) Appl. No.: 18/701,639

(22) PCT Filed: Sep. 28, 2022

(86) PCT No.: PCT/EP2022/025449
§ 371 (c)(1),
(2) Date: Apr. 16, 2024

(87) PCT Pub. No.: WO2023/066513
PCT Pub. Date: Apr. 27, 2023

(65) Prior Publication Data
US 2024/0410558 A1    Dec. 12, 2024

Related U.S. Application Data

(60) Provisional application No. 63/257,650, filed on Oct. 20, 2021.

(30) Foreign Application Priority Data

Dec. 1, 2021   (DE) .......................... 102021005949.2

(51) Int. Cl.
*H01B 17/58*    (2006.01)
*F21V 19/00*    (2006.01)
(Continued)

(52) U.S. Cl.
CPC .......... *F21V 23/002* (2013.01); *F21V 19/003* (2013.01); *H01B 17/583* (2013.01); *F21Y 2115/10* (2016.08)

(58) Field of Classification Search
CPC ............ H01R 13/7172; H01R 13/7175; H01R 13/717; H01R 13/5816; H01R 13/58; H01B 17/583; F21V 23/002
See application file for complete search history.

(56) References Cited

U.S. PATENT DOCUMENTS 6,328,603 B1 * 12/2001 Chang ................ H01R 13/7175
   174/51
6,572,402 B2 * 6/2003 Lin .................... H01R 13/7172
   439/490

(Continued)

FOREIGN PATENT DOCUMENTS

| CN | 112086920 A | 12/2020 |
| DE | 3123594 A1 | 1/1983 |

(Continued)

OTHER PUBLICATIONS

International Search Report issued in corresponding International Application No. PCT/EP2022/025449 dated Feb. 14, 2023, pp. 1-2, English Translation.

(Continued)

*Primary Examiner* — Ismael Negron
(74) *Attorney, Agent, or Firm* — Carter, DeLuca & Farrell LLP

(57) ABSTRACT

In an electrical appliance having a housing, a cable bushing projects through a recess in the housing, a cable is passed (Continued)

through the cable bushing, a printed circuit board including a luminous device is surrounded by the housing, the cable bushing is made of a transparent material, and the luminous device is adapted to project light into the cable bushing.

23 Claims, 2 Drawing Sheets

(51) Int. Cl.
*F21V 23/00* (2015.01)
*F21Y 115/10* (2016.01)

(56) References Cited

U.S. PATENT DOCUMENTS

| | | | | |
|---|---|---|---|---|
| 8,038,355 B2 * | 10/2011 | Hashiguchi | ........ | H01R 13/7172 385/75 |
| 8,303,333 B2 * | 11/2012 | Lee | .................... | H01R 13/7175 439/488 |
| 9,484,685 B2 * | 11/2016 | Zhou | .................. | H01R 13/7172 |
| 9,660,395 B2 * | 5/2017 | Yeom | ................. | H01R 13/7172 |
| 9,843,146 B1 * | 12/2017 | Chen | .................. | H01R 13/7172 |
| 10,535,961 B2 * | 1/2020 | Cote | ................. | H01R 13/7172 |
| 11,909,146 B2 * | 2/2024 | Schneider | .......... | H01R 13/7172 |
| 2002/0009920 A1 * | 1/2002 | Wijma | ................. | H01R 13/717 439/502 |
| 2007/0085761 A1 | 4/2007 | Schoen | | |
| 2007/0217179 A1 | 9/2007 | Schoen | | |
| 2009/0280677 A1 * | 11/2009 | Gingrich, III | ..... | H01R 13/7172 439/490 |
| 2016/0172796 A1 * | 6/2016 | Humphreys | ....... | H01R 13/7172 439/620.21 |
| 2024/0075824 A1 * | 3/2024 | Shibata | .............. | H01R 13/7172 |

FOREIGN PATENT DOCUMENTS

| | | | |
|---|---|---|---|
| DE | 8706148 U1 | 7/1987 | |
| DE | 19832533 C1 * | 11/1999 | ....... B29C 45/14639 |
| DE | 19504608 C2 | 3/2002 | |
| DE | 10343529 A1 | 4/2005 | |
| DE | 10359885 B4 | 5/2006 | |
| DE | 102010040310 A1 | 11/2011 | |
| EP | 0974809 A2 | 1/2000 | |

OTHER PUBLICATIONS

International Report on Patentability issued in corresponding International Application No. PCT/EP2022/025449 dated Apr. 23, 2024, pp. 1-8, English Translation.

* cited by examiner

ELECTRICAL APPLIANCE WITH HOUSING HAVING AN ILLUMINATED CABLE BUSHING

CROSS-REFERENCE TO RELATED APPLICATIONS

The present application is the national stage of PCT International Patent Application No. PCT/EP2022/025449, filed on Sep. 28, 2022, which claims the benefit of and priority to U.S. Provisional Application No. 63/257,650, filed on Oct. 20, 2021, and which claims priority to German Patent Application No. 10 2021 005 949.2, filed on Dec. 1, 2021, each of which is expressly incorporated herein in its entirety by reference thereto.

FIELD OF THE INVENTION

The present invention relates to an electrical appliance with a housing.

BACKGROUND INFORMATION

In certain conventional systems, a cable bushing allows a cable to be passed through a housing wall.

German Patent Document No. 198 32 533 describes a method for manufacturing a position sensor.

A method for producing a switching device is described in German Patent Document No. 103 59 885.

A position sensor is described in German Patent Document No. 195 04 608.

A device for the optical transmission of information is described in German Patent Document No. 103 43 529.

A cable gland is described in German Patent Document No. 10 2010 040 310.

SUMMARY

Example embodiments of the present invention provide an electrical appliance having improved safety at low cost.

According to example embodiments of the present invention, an electrical appliance includes a housing, in which a cable bushing projects through a recess in the housing, and a cable is passed through the cable bushing. A printed circuit board equipped with a luminous device, e.g., an LED, is surrounded by the housing, and the cable bushing is made of a transparent material, e.g., which is transparent to light, transparent to light emitted by the luminous device, etc.

Thus, the cable is passed through the housing wall with a high degree of protection and the light of a luminous device serving, for example, as a status display, can be directed through the cable bushing and thus the status information displayed in the inner space of the electrical appliance can be recognized and/or perceived from the outer environment. Improved safety can thus be achieved, in which only a few components are required and manufacture is thus cost-effective.

According to example embodiments, the cable bushing is arranged as a rotational body, and the axis of symmetry of the rotational body is aligned parallel to the axial direction. Thus, ready production is possible.

According to example embodiments, the light emitted by the luminous device, e.g., a light cone emitted by the luminous device, irradiates into an end face of the cable bushing and/or in the axial direction into the cable bushing. Thus, as much light as possible is directed into the external environment, and improved recognizability can be achieved.

According to example embodiments, the light emitted by the luminous device, e.g., a light cone emitted by the luminous device, irradiates in the radial direction into the cable bushing, e.g., in the radial direction into a region of the cable bushing projecting into the inner space of the electrical appliance surrounded by the housing. For example, the region has a cylindrical outer circumference. Thus, even with radial irradiation, a high proportion can be directed into the external environment. This is because the light directed into the cable bushing is transmitted through the cable bushing to the external environment in a similar manner as with a light conductor with total reflections.

According to example embodiments, the cable bushing has a first region and a second region, which is, for example, adjacent to the first region. The first region has a cylindrical outer circumference, and/or the second region is a corrugated region. Thus, the cylindrical region projects into or is arranged in the inner space, and the corrugated region is arranged in the outer space, and thus the outer space is being illuminated as well as possible.

According to example embodiments, the outer diameter of the cable bushing in the second region has a periodic curve in the axial direction. For example, the outer diameter is respectively measured in a plane whose normal direction is aligned parallel to the axial direction. Thus, a striped pattern improves perception and makes recognition more readily possible, which leads to increased safety.

According to example embodiments, the outer diameter of the cable bushing decreases, e.g., monotonically, with increasing distance from the housing. Thus, improved illumination of the outer space can be achieved.

According to example embodiments, the housing is made of a material that does not allow the light emitted by the luminous device to pass through. Thus, the light from a status LED display is directed into the outer space via the cable bushing despite the non-transparent material of the housing.

According to example embodiments, the outer diameter of the cable bushing has local maxima as a function of the distance from the housing, e.g., in the axial direction, e.g., which decrease strictly monotonically and/or have smaller values with increasing distance from the housing. Thus, the cable bushing has a tip facing away from the housing, and the light is emitted as close as possible from the housing to the outer space.

According to example embodiments, at least one of the local maxima has a greater value than the value of the clear, e.g., largest, inside diameter of the recess of the housing. Thus, the cable bushing is positively secured in the direction of insertion and/or in the axial direction. For example, the outer diameter of the cylindrical region is also larger than the clear inner diameter of the recess.

According to example embodiments, the recess is arranged as a round hole. Thus, ready manufacture is possible.

According to example embodiments, the cable bushing is elastically deformed such that the material of the cable bushing presses and/or seals towards the housing, and the cable bushing is elastically deformed such that the material of the cable bushing presses and/or seals towards the cable. Thus, a high type of protection can be achieved because the elastic restoring force also closes small depressions in a non-rough surface of the edge of the recess.

According to example embodiments, the cable surrounds electrical lines, e.g., radially, which are respectively routed to a respective connecting element, which is arranged on the printed circuit board, and electrically connected, e.g., to a metallic contact element of the connecting element, and the contact element is soldered to a conductive path of the printed circuit board. Thus, the cable bushing provides for sealing and display, i.e., to display a status LED.

According to example embodiments, the material of the cable bushing is a polycarbonate, a PVC, or a polyethylene. For example, an adhesive is arranged between the cable bushing and the housing for additional sealing of the cable bushing towards the housing, e.g., if the cable bushing is made of polycarbonate. Thus, inexpensive manufacture is possible.

Further features and aspects of example embodiments of the present invention are explained in more detail below with reference to the appended schematic Figures.

DETAILED DESCRIPTION

Figure 1:
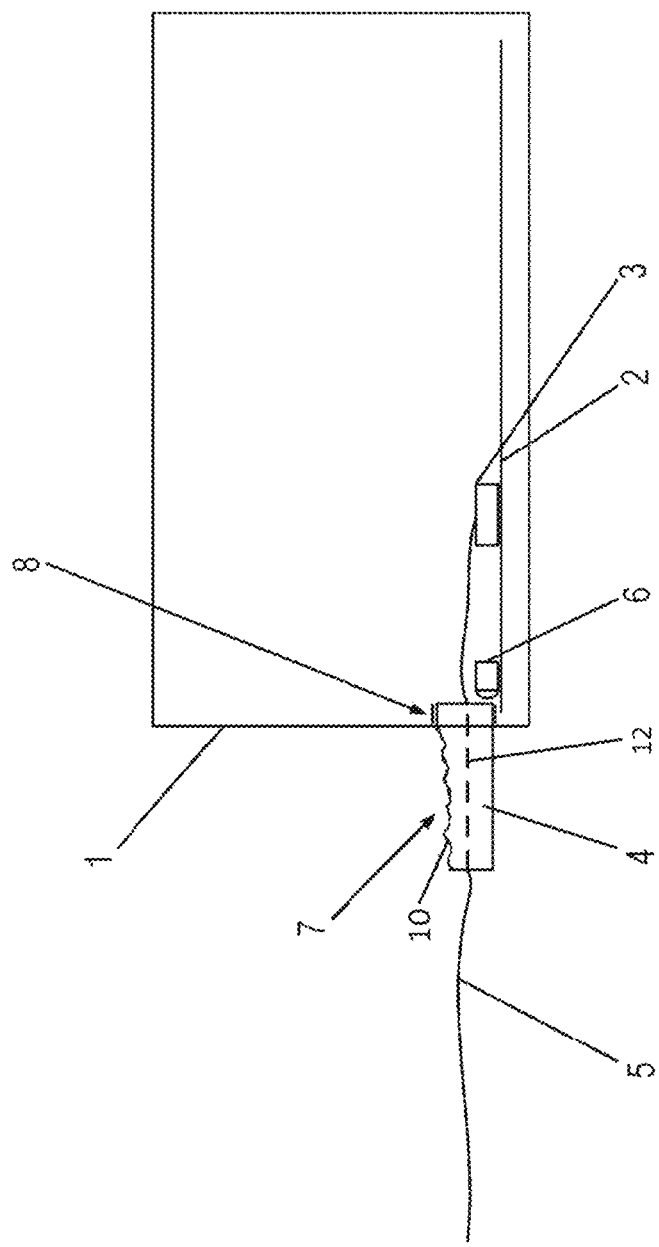
FIG. 1 is a schematic view of a first electrical appliance.

As illustrated in FIG. 1, the first electrical appliance has a printed circuit board 2 equipped with electronic components, including, for example, at least one connecting element that includes a metallic contact element 14 arranged on the printed circuit board.

A cable 5 including electrical lines is routed into the inner space region of the first electrical appliance via a cable bushing 4, which inner space region is surrounded, e.g., enclosed, by the housing 1.

The cable 5 is passed through a recess in the cable bushing 4.

The cable bushing 4 projects through a recess in the housing 1.

The cable bushing 4 has a material which is permeable to light, thus a material which is, e.g., transparent. For example, the material is a plastic, e.g., PVC or polyethylene.

The housing 1 is made of a material that is impermeable to light.

Thus, the light from a luminous device 6, which is provided on the printed circuit board 2, reaches the external environment through the cable bushing 4.

As illustrated in FIG. 1, the luminous device 6 is arranged on the printed circuit board 2 such that the light cone, e.g., the radiation cone, generated by the luminous device 6 is directed towards the end face of the cable bushing 4, e.g., is thus aligned parallel to the region of the cable 5 accommodated by the cable bushing 4.

For example, the region covered by the cable bushing 4 in the normal direction of the printed circuit board plane overlaps with the region covered by the luminous device 6 in the normal direction of the printed circuit board plane.

The respective electrical line of the cable 5 is routed in the inner space to a respective connecting element 3, which is provided on the printed circuit board 2, and electrically connected there.

The corrugated region of the cable bushing 4 improves the visual perception of the light being directed through, because, as a result of the alternating thickened and thinned regions of the cable bushing, lighter regions alternate with darker regions and the stripe-like pattern created in this manner generates increased attention.

Figure 2:
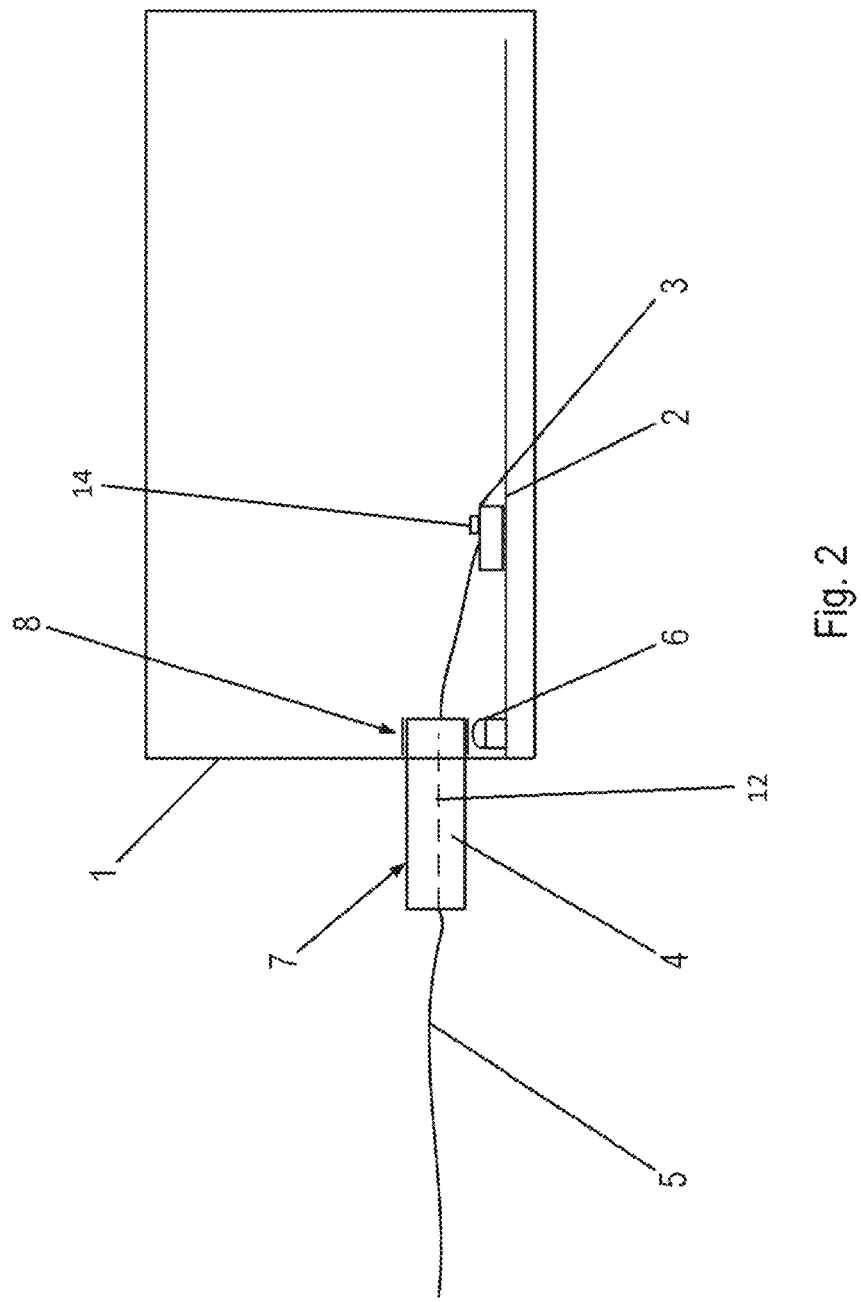
FIG. 2 is a schematic view of a second electrical appliance.

As illustrated in FIG. 2, however, the luminous device 6 can alternatively be arranged such that the light cone, e.g., the radiation cone, generated by the luminous device 6 irradiates into the cable bushing 4 laterally, e.g., from the radial direction relative to the axis of symmetry of the cable bushing, a bore axis 12, and/or the pass-through direction of the cable bushing 4. For example, this region 8 of the cable bushing is cylindrical and/or annular. Thus, uniform irradiation can be achieved and a high proportion of the irradiated light is passed through the cable bushing 4 to the external environment.

The region 7 of the cable bushing 4 that projects towards the external environment is corrugated, e.g., with an outer diameter that changes periodically in the axial direction. Here, the axial direction is parallel to the axis of symmetry of the cable bushing and/or to the pass-through direction of the cable bushing 4.

For example, the cable bushing 4 is a rotating body. Thus, the cable bushing 4 has a continuous rotational symmetry, e.g., the axis of symmetry is aligned parallel to the axial direction.

In further example embodiments, the corrugated region 7 becomes increasingly narrower with increasing distance from the housing 1, as schematically indicated in FIG. 1 by line 10. Thus, the peak value of the diameter of the cable bushing measured over a respective period decreases strictly monotonically with increasing distance of the period from the housing. Here, the period is understood to be, for example, the axial region whose extension in the axial direction is equal to the period length of the periodic curve of the outer diameter.

In this manner, improved illumination into the external environment can be achieved.

The invention claimed is:

1. An electrical appliance, comprising:
a housing;
a printed circuit board including an illumination device surrounded by the housing;
a cable bushing projecting through a recess in the housing and formed of a transparent material; and
a cable passing through the cable bushing;
wherein the cable bushing is elastically deformed such that a material of the cable bushing presses and/or seals towards the housing, and the cable bushing is elastically deformed such that the material of the cable bushing presses and/or seals towards the cable.

2. The electrical appliance according to claim 1, wherein the cable bushing has a first region and a second region, the first region having a cylindrical outer circumference and/or the second region arranged a corrugated region.

3. The electrical appliance according to claim 2, wherein an outer diameter of the cable bushing in the second region has a periodic curve in an axial direction.

4. The electrical appliance according to claim 2, wherein an outer diameter of the cable bushing, measured in a plane having a normal direction aligned parallel to an axial direction, has a periodic curve in the axial direction.

5. The electrical appliance according to claim 2, wherein the outer diameter of the cable bushing has local maxima as a function of a distance from the housing.

6. The electrical appliance according to claim 5, wherein the local maxima decrease strictly monotonically and/or have smaller values with increasing distance from the housing.

7. The electrical appliance according to claim 5, wherein at least one of the local maxima has a greater value than a value of a clear inside diameter and/or largest inside diameter of the recess of the housing.

8. An electrical appliance, comprising:
a housing;

a printed circuit board including an illumination device surrounded by the housing;
a cable bushing projecting through a recess in the housing and formed of a transparent material; and
a cable passing through the cable bushing;
wherein the cable bushing has a first region and a second region, the first region having a cylindrical outer circumference, and the second region being arranged as a corrugated region;
wherein the outer diameter of the cable bushing in the second region decreases with increasing distance from the housing.

9. The electrical appliance according to claim 8, wherein the illumination device is adapted to emit light and/or a light cone that irradiates into an end face of the cable bushing and/or in an axial direction into the cable bushing.

10. The electrical appliance according to claim 8, wherein the illumination device is adapted to emit light and/or a light cone that irradiates into the cable bushing in a radial direction with respect to a direction of the cable bushing direction and/or a bore axis.

11. The electrical appliance according to claim 8, wherein the second region is adjacent to the first region.

12. An electrical appliance, comprising:
a housing;
a printed circuit board including an illumination device surrounded by the housing;
a cable bushing projecting through a recess in the housing and formed of a transparent material; and
a cable passing through the cable bushing;
wherein the illumination device is adapted to emit light and/or a light cone that irradiates into the cable bushing in a radial direction with respect to a direction of the cable bushing direction and/or a bore axis;
wherein the cable bushing has a first region and a second region, the first region having a cylindrical outer circumference, and the second region being arranged as a corrugated region; and
wherein the outer diameter of the cable bushing in the second region decreases with increasing distance from the housing.

13. The electrical appliance according to claim 12, wherein the illumination device includes an LED.

14. The electrical appliance according to claim 12, wherein the transparent material is transparent to light emitted by the illumination device.

15. The electrical appliance according to claim 12, wherein the cable bushing is arranged as a rotational body, an axis of symmetry and/or an axis of rotational symmetry of the rotational body is aligned parallel to an axial direction and/or a direction of the cable bushing.

16. The electrical appliance according to claim 12, wherein the recess is arranged as a round hole, a center axis and/or a center line of the round hole aligned parallel to an axial direction, or a bore hole and/or a threaded bore, a bore axis of the bore hole and/or the threaded bore aligned parallel to the axial direction.

17. The electrical appliance according to claim 12, wherein the housing is made of a material that does not allow the light emitted by the illumination device to pass through.

18. The electrical appliance according to claim 12, wherein the recess is arranged as a round hole.

19. The electrical appliance according to claim 12, wherein at least one connecting element that includes a metallic contact element is arranged on the printed circuit board, the cable surrounds and/or radially surrounds electrical lines that are routed to a respective connecting element, and electrically connected to a respective metallic contact element, the contact element being solder connected to a conductive path of the printed circuit board.

20. The electrical appliance according to claim 12, wherein the illumination device is adapted to emit light and/or a light cone that irradiates into the cable bushing in the radial direction into a region of the cable bushing projecting into an inner space of the electrical appliance surrounded by the housing.

21. The electrical appliance according to claim 20, wherein the region has a cylindrical outer circumference.

22. The electrical appliance according to claim 12, wherein a material of the cable bushing is a polycarbonate, a PVC, and/or a polyethylene.

23. The electrical appliance according to claim 22, wherein an adhesive is arranged between the cable bushing and the housing for additional sealing of the cable bushing towards the housing.

* * * * *